United States Patent
Jang et al.

(10) Patent No.: US 6,391,792 B1
(45) Date of Patent: May 21, 2002

(54) MULTI-STEP CHEMICAL MECHANICAL POLISH (CMP) PLANARIZING METHOD FOR FORMING PATTERNED PLANARIZED APERTURE FILL LAYER

(75) Inventors: Syun-Ming Jang, Hsin-Chu; Juing-Yi Cheng, Chishang Town, Kaoshing County; Chung-Long Chang, Dou-Liu, all of (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 09/573,981

(22) Filed: May 18, 2000

(51) Int. Cl.[7] ............................................. H01L 21/302
(52) U.S. Cl. ...................... 438/734; 438/691; 438/692
(58) Field of Search ................................ 438/734, 691, 438/692, 693, 694

(56) References Cited

U.S. PATENT DOCUMENTS

| 5,728,621 A | 3/1998 | Zheng et al. |
| 5,880,007 A | 3/1999 | Varian et al. |
| 5,911,110 A | 6/1999 | Yu |
| 5,945,724 A | * 8/1999 | Parekh et al. |
| 6,051,496 A | * 4/2000 | Jang ............................. 438/687 |
| 6,069,081 A | * 5/2000 | Kelleher et al. ............ 438/692 |
| 6,117,740 A | * 9/2000 | Lin et al. .................... 438/296 |
| 6,120,354 A | * 9/2000 | Koos et al. .................... 451/41 |

* cited by examiner

Primary Examiner—Caridad Everhart
(74) Attorney, Agent, or Firm—Tung & Associates

(57) ABSTRACT

Within a method for forming an aperture fill layer within a aperture, there is first provided a topographic substrate having an aperture formed therein. There is then formed over the topographic substrate and filling the aperture a blanket aperture fill layer. There is then planarized, while employing a first chemical mechanical polish (CMP) planarizing method, the blanket aperture fill layer to form a blanket planarized aperture fill layer while not reaching the topographic substrate. Finally, there is then planarized, while employing a second planarizing method, the blanket planarized aperture fill layer to form within the aperture a patterned planarized aperture fill layer. The two step planarizing method may be employed for forming with enhanced planarity and attenuated topographic substrate erosion a patterned planarized aperture fill layer, such as a patterned planarized trench isolation region, within a topographic substrate, such as a topographic semiconductor substrate.

18 Claims, 5 Drawing Sheets

MULTI-STEP CHEMICAL MECHANICAL POLISH (CMP) PLANARIZING METHOD FOR FORMING PATTERNED PLANARIZED APERTURE FILL LAYER

BACKGROUND OF THE INVENTION

1. Field of the Invention

The present invention relates generally to methods for forming patterned planarized aperture fill layers within apertures within topographic substrates employed microelectronic fabrications. More particularly, the present invention relates to methods for forming, with enhanced planarity and with attenuated topographic substrate erosion, patterned planarized aperture fill layers within apertures within topographic substrates employed within microelectronic fabrications.

2. Description of the Related Art

Microelectronic fabrications are formed from microelectronic substrates over which are formed patterned microelectronic conductor layers which are separated by microelectronic dielectric layers.

As microelectronic fabrication integration levels have increased and patterned microelectronic conductor layer dimensions have decreased, it has become increasingly more common within the art of microelectronic fabrication, and particularly within the art of semiconductor integrated circuit microelectronic fabrication, to form within apertures within topographic substrates, and particularly within isolation trenches within topographic semiconductor substrates, patterned planarized aperture fill layers, and in particular patterned planarized trench isolation regions. In particular with respect to patterned planarized trench isolation regions, patterned planarized trench isolation regions method as are trenches within topographic semiconductor substrates within semiconductor integrated circuit microelectronic fabrications are desirable insofar as they provide semiconductor integrated circuit microelectronic fabrications which may be fabricated with enhanced functionality, enhanced reliability and enhanced yield.

While patterned planarized aperture fill layers, such as but not limited to patterned planarized trench isolation regions, are thus desirable in the art of microelectronic fabrication, patterned planarized aperture fill layers, such as but not limited to patterned planarized trench isolation regions, are not formed entirely without problems in the art of microelectronic fabrication. In particular, when forming within microelectronic fabrications patterned planarized aperture fill layers such as but not limited to patterned planarized trench isolation regions while employing conventional chemical mechanical polish (CMP) planarizing methods, such patterned planarized aperture fill layers are often formed with dishing within the patterned planarized aperture fill layers and/or with erosion of adjoining portions of a topographic substrate layer into which are formed the patterned planarized aperture fill layers.

It is thus towards the goal of forming within the art of microelectronic fabrication patterned planarized apertures fill layers, such as but not limited to patterned planarized trench isolation regions, with enhanced planarity and with attenuated topographic substrate erosion, that the present invention is directed.

Various methods for forming patterned planarized aperture fill layers within apertures within topographic substrates employed within microelectronic fabrications, and in particular patterned planarized shallow trench isolation (STI) regions within shallow isolation trenches within topographic semiconductor substrates employed within semiconductor integrated circuit microelectronic fabrications, have been disclosed within the art of microelectronic fabrication, and in particular in the art of semiconductor integrated circuit microelectronic fabrication.

For example, Zheng et al., in U.S. Pat. No. 5,728,621, disclose a method for forming, with enhanced planarity, within a shallow isolation trench formed within a topographic semiconductor substrate employed within a semiconductor integrated circuit microelectronic fabrication, a patterned planarized shallow trench isolation (STI) region formed employing a high density plasma chemical vapor deposition (HDP-CVD) method. To realize the foregoing result, the method employs a composite bilayer comprising a sacrificial spin-on-glass (SOG) planarizing layer formed upon a blanket high density plasma chemical vapor deposition (HDP-CVD) deposited dielectric layer in turn formed within the shallow isolation trench within the topographic semiconductor substrate, where the composite bilayer is first etched back while employing a blanket etchback method, and then chemical mechanical polish (CMP) planarized.

In addition, Varian et al., in U.S. Pat. No. 5,880,007 also disclose a method for forming, with enhanced planarity, within a shallow isolation trench formed within a topographic semiconductor substrate employed within a semiconductor integrated circuit microelectronic fabrication, a patterned planarized shallow trench isolation (STI) region formed employing a high density plasma chemical vapor deposition (HDP-CVD) method. To realize the foregoing result, the method employs formed upon a high density plasma chemical vapor deposition (HDP-CVD) deposited dielectric layer formed within the shallow isolation trench within the topographic semiconductor substrate a conformal sacrificial polish stop layer, in conjunction with a three step planarizing method which employs: (1) a first chemical mechanical polish (CMP) planarizing method, followed by; (2) a selective reactive ion etch (RIE) etchback method, in turn followed by; (2) a second chemical mechanical polish (CMP) planarizing method.

Further, Yu, in U.S. Pat. No. 5,911,110, discloses a method for forming, with enhanced planarity and with attenuated substrate damage, within a shallow isolation trench formed within a topographic semiconductor substrate employed within a semiconductor integrated circuit microelectronic fabrication, a patterned planarized shallow trench isolation (STI) region. To realize the foregoing result, the method employs: (1) a selective reactive ion etch (RIE) etchback of a blanket shallow isolation trench fill dielectric layer to form a patterned shallow isolation trench fill dielectric layer while employing a reverse tone mask which also incorporates therein a dummy pattern over a comparatively wide mesa portion of the topographic semiconductor substrate, followed by; (2) a chemical mechanical polish (CMP) planarizing of the patterned shallow isolation trench fill dielectric layer while employing a chemical mechanical polish (CMP) planarizing method.

Finally, Parekh et al., in U.S. Pat. No. 5,945,724, disclose a method for forming, with rounded corners, within a semiconductor substrate employed within a semiconductor integrated circuit microelectronic fabrication, a shallow isolation trench which thus provides when planarized within the shallow isolation trench a patterned planarized shallow trench isolation (STI) region also formed with rounded corners. To realize the foregoing result, the method employs when forming the shallow isolation trench with the rounded corners within the semiconductor substrate a sacrificial spacer layer formed within an aperture within a masking layer which is employed for defining the shallow isolation trench while employing a reactive ion etch (RIE) shallow isolation trench etch method.

Desirable in the art of microelectronic fabrication are additional methods and materials which may be employed for forming with enhanced planarity and with attenuated topographic substrate erosion within topographic substrates employed within microelectronic fabrications, such as but not limited to semiconductor integrated circuit microelectronic fabrications, patterned planarized apertures fill layers, such as but not limited to patterned planarized trench isolation regions, within apertures, such as but not limited to isolation trenches, within those topographic substrates within those microelectronic fabrications.

It is towards the foregoing object that the present invention is directed.

SUMMARY OF THE INVENTION

A first object of the present invention is to provide a method for forming within an aperture within a topographic substrate employed within a microelectronic fabrication a patterned planarized aperture fill layer.

A second object of the present invention is to provide a method in accord with the first object of the present invention, wherein the patterned planarized aperture fill layer is formed with enhanced planarity and with attenuated topographic substrate erosion.

A third object of the present invention is to provide a method in accord with the first object of the present invention and the second object of the present invention, wherein the microelectronic fabrication is a semiconductor integrated circuit microelectronic fabrication, the substrate is a semiconductor substrate, the aperture is a shallow isolation trench and the patterned planarized aperture fill layer is patterned planarized trench isolation region.

A fourth object of the present invention is to provide a method in accord with the first object of the present invention, the second object of the present invention and the third object of the present invention, which method is readily commercially implemented.

In accord with the objects of the present invention, there is provided by the present invention a method for forming within an aperture within a topographic substrate employed within a microelectronic fabrication a patterned planarized aperture fill layer. To practice the method of the present invention, there is first provided a topographic substrate having an aperture formed therein. There is then formed over the substrate and filling the aperture a blanket aperture fill layer. There is then planarized, while employing a first chemical mechanical polish (CMP) planarizing method, the blanket aperture fill layer to form a blanket planarized aperture fill layer while not reaching the topographic substrate. Finally, there is then planarized, while employing a second planarizing method, the blanket planarized aperture fill layer to form within the aperture a patterned planarized aperture fill layer.

There is provided by the present invention a method for forming within an aperture within a topographic substrate employed within a microelectronic fabrication a patterned planarized aperture fill layer, wherein the patterned planarized aperture fill layer is formed with enhanced planarity and with attenuated topographic substrate erosion. The present invention realizes the foregoing objects by employing when forming the patterned planarized aperture fill layer from a corresponding blanket aperture fill layer a two step planarizing method comprising: (1) a first chemical mechanical polish (CMP) planarizing method for forming from the blanket aperture fill layer a blanket planarized aperture fill layer while not reaching the topographic substrate; and (2) a second planarizing method for forming from the blanket planarized aperture fill layer the patterned planarized aperture fill layer. By employing within the method of the present invention two separate planarizing methods for forming from a blanket aperture fill layer formed over a topographic substrate and filling an aperture within the topographic substrate a patterned planarized aperture fill layer within the aperture, each of the two separate planarizing methods may be independently optimized to either provide enhanced planarity or provide enhanced selectivity (and thus attenuated topographic substrate erosion) when forming in accord with the present invention the patterned planarized aperture fill layer within the aperture within the topographic substrate.

The present invention may be employed where the microelectronic fabrication is a semiconductor integrated circuit microelectronic fabrication, the topographic substrate is a topographic semiconductor substrate, the aperture is an isolation trench and the patterned planarized aperture fill layer is a patterned planarized trench isolation region. Although the present invention provides particular value when employed for forming within a shallow isolation trench within a topographic semiconductor substrate employed within a semiconductor integrated circuit microelectronic fabrication a patterned planarized trench isolation region, the present invention is not solely limited thereto. In that regard, the present invention may be employed for forming patterned planarized aperture fill layers including but not limited to patterned planarized aperture fill conductor layers, patterned planarized aperture fill semiconductor layers and patterned planarized aperture fill dielectric layers within apertures within topographic substrates including but not limited to topographic conductor substrates, topographic semiconductor substrates and topographic dielectric substrates within microelectronic fabrications including but not limited to semiconductor integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

The method of the present invention is readily commercially implemented. The present invention employs methods and materials which are otherwise generally known in the art of microelectronic fabrication, but employed within the context of a specific ordering and process parameter control to provide the present invention. Since it is thus a process ordering and process control which provides at least in part the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying drawings, which form a material part of this disclosure, wherein.

DESCRIPTION OF THE PREFERRED EMBODIMENTS

The present invention provides a method for forming within an aperture within a topographic substrate employed within a microelectronic fabrication a patterned planarized aperture fill layer, wherein the patterned planarized aperture fill layer is formed with enhanced planarity and with attenuated topographic substrate erosion. The present invention realizes the foregoing object by employing when forming the patterned planarized aperture fill layer from a corresponding blanket aperture fill layer formed over the topographic substrate and filling the aperture a two step planarizing method comprising: (1) a first chemical mechanical polish (CMP) planarizing method for forming from the blanket aperture fill layer a blanket planarized aperture fill layer while not reaching the topographic substrate; and (2) a second planarizing method for forming from the blanket planarized aperture fill layer the patterned planarized aperture fill layer. By employing within the method of the present invention two separate planarizing methods, the two separate planarizing methods may be independently optimized to either provide enhanced planarity or provide enhanced selectivity (and thus attenuated topographic substrate erosion) when forming in accord with the present invention the patterned planarized aperture fill layer within the aperture within the topographic substrate.

Although the present invention provides particular value when employed for forming within an isolation trench within a topographic semiconductor substrate employed within a semiconductor integrated circuit microelectronic fabrication a patterned planarized trench isolation region, the present invention is not solely limited thereto. In that regard, the present invention may be employed for forming patterned planarized aperture fill layers including but not limited to patterned planarized aperture fill conductor layers, patterned planarized aperture fill semiconductor layers and patterned planarized aperture fill dielectric layers within apertures within topographic substrates including but not limited to topographic conductor substrates, topographic semiconductor substrates and topographic dielectric substrates within microelectronic fabrications including but not limited to semiconductor integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

First Preferred Embodiment

Figure 1:
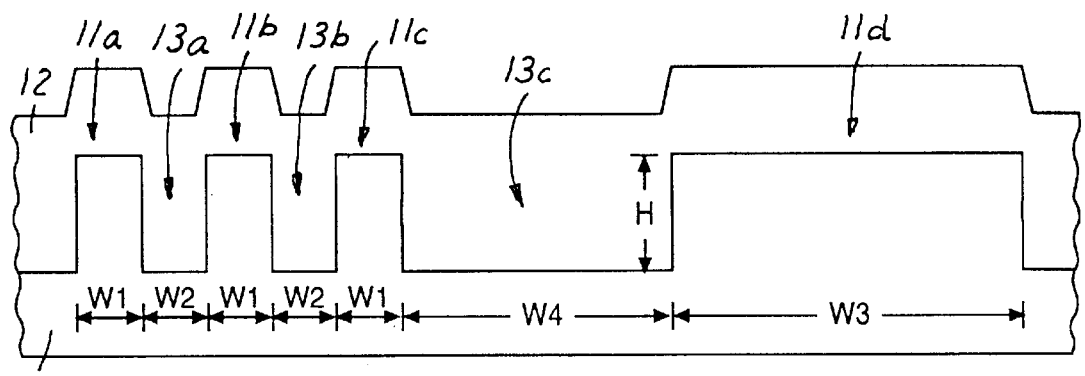
FIG. 1, FIG. 2 and FIG. 3 show a series of schematic cross-sectional diagrams illustrating the results of progressive stages in forming, in accord with a general embodiment of the present invention which comprises a first preferred embodiment of the present invention, a series of patterned planarized aperture fill layers within a series of apertures within a topographic substrate employed within a microelectronic fabrication.
Figure 2:
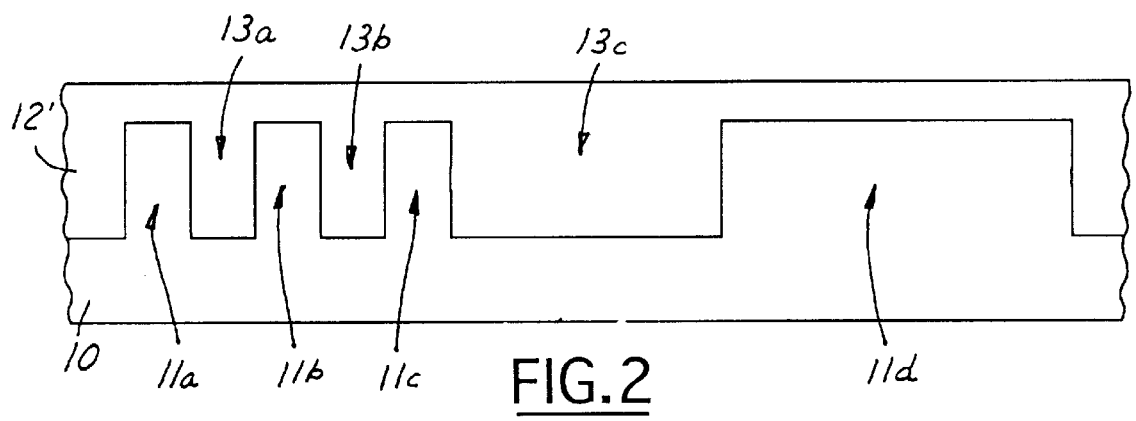
Figure 3:
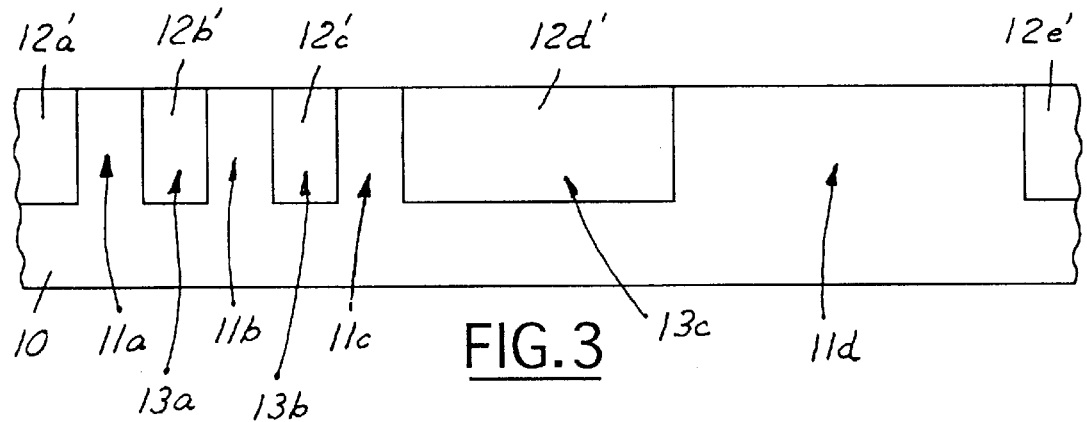

Referring now to FIG. 1 to FIG. 3, there is shown a series of schematic cross-sectional diagrams illustrating the results of progressive stages in forming, in accord with a general embodiment of the present invention which comprises a first preferred embodiment of the present invention, a series of patterned planarized aperture fill layers within a series of apertures within a topographic substrate within a microelectronic fabrication. Shown in FIG. 1 is a schematic cross-sectional diagram of the microelectronic fabrication at an early stage in its fabrication in accord with the first preferred embodiment of the present invention.

Shown in FIG. 1 in a first instance in a topographic substrate 10 characterized by a series of comparatively narrow mesas 11a, 11b and 11c which are separated by a pair of comparatively narrow apertures 13a and 13b, and wherein the series of comparatively narrow mesas 11a, 11b and 11c is separated from a comparatively wide mesa 11d by a comparatively wide aperture 13c.

Within the first preferred embodiment of the present invention the topographic substrate 10 may be employed within a microelectronic fabrication selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Similarly, within the first preferred embodiment of the present invention with respect to the topographic substrate 10, the topographic substrate 10 may be formed from microelectronic materials including but not limited to microelectronic conductor materials, microelectronic semiconductor materials, microelectronic dielectric materials, laminates thereof, aggregates therof and composites therof. For example, and without limitation, with respect to laminates of the foregoing materials the comparatively narrow mesas 11a, 11b, and 11c and the comparatively wide mesa 11d within the topographic substrate 10 as illustrated within the schematic cross-sectional diagram of FIG. 1 may be formed from a microelectronic conductor material, while a remaining substantially horizontal and substantially planar portion of the topographic substrate 10 may be formed of a microelectronic dielectric material.

Similarly, although not specifically illustrated within the schematic cross-sectional diagram of FIG. 1, the topographic substrate 10, typically but not exclusively when the topographic substrate comprises a semiconductor substrate employed within a semiconductor integrated circuit microelectronic fabrication, will have formed therein and/or thereupon microelectronic devices as are conventional within the microelectronic fabrication within which is employed the topographic substrate 10. Such microelectronic devices may include, but are not limited to resistors, transistors, diodes and capacitors.

As is illustrated within the schematic cross-sectional diagram of FIG. 1, each of the comparatively narrow mesas 11a, 11b and 11c typically and preferably has a linewidth W1 of from about 0.1 to about 1.0 microns, while the comparatively wide mesa lid typically and preferably has a linewidth W3 of from about 1.0 to about 2000 microns. As is similarly also illustrated within the schematic cross-sectional diagram of FIG. 1, each of the comparatively narrow apertures 13a and 13b, typically and preferably has an aperture width W2 of from about 0.1 to about 1.0 microns, while the comparatively wide aperture 13c typically and preferably has an aperture width W4 of from about 1.0 to about 2000 microns. Finally, as is also illustrated within the schematic cross-sectional diagram of FIG. 1 each of the comparatively narrow apertures 13a and 13b, and the comparatively wide aperture 13c, has an aperture depth H of from about 2500 to about 6000 angstroms.

Finally, there is also shown within the schematic cross-sectional diagram of FIG. 1 a blanket aperture fill layer 12 formed upon the topographic substrate 10 and completely filling each of the comparatively narrow apertures 13a and 13b and the comparatively wide aperture 13c.

Within the first preferred embodiment of the present invention, the blanket aperture fill layer 12 may be formed from an aperture fill material selected from the group including but not limited to aperture fill conductor materials, aperture fill semiconductor materials and aperture fill dielectric materials.

Although the schematic cross-sectional diagram of FIG. 1 illustrates the blanket aperture fill layer 12 as being formed with a surface topography consistent with the blanket aperture fill layer 12 having been formed employing a high density plasma chemical vapor deposition (HDP-CVD) method, it is not required within either the present invention or the first preferred embodiment of the present invention that the blanket aperture fill layer 12 be formed employing a high density plasma chemical vapor deposition (HDP-CVD) method. In that regard, the blanket aperture fill layer 12 may be formed employing methods including but not limited to chemical vapor deposition (CVD) methods (such as but not limited to thermal chemical vapor deposition (CVD) methods and plasma enhanced chemical vapor deposition (PECVD) methods such as but not limited to high density plasma chemical vapor deposition (HDP-CVD) methods) and physical vapor deposition (PVD) methods (such as but not limited to evaporative deposition methods and sputtering deposition methods). Although the present invention and the first preferred embodiment of the present invention provide optimal value under circumstances where the blanket aperture fill layer 12 is formed with a surface topography other than a planar surface topography, the present invention and the first preferred embodiment of the present invention also provide value when the blanket aperture fill layer 12 is formed with a planar surface topography. Typically and preferably, the blanket aperture fill layer 12 is formed to a thickness of from about 3000 to about 9000 angstroms upon the topographic substrate.

Similarly, although not specifically illustrated within the schematic cross-sectional diagram of FIG. 1, it is also feasible within the present invention and the first preferred embodiment of the present invention to provide within the blanket aperture fill layer 12 within the first preferred embodiment of the present invention additional surface topography of the blanket aperture fill layer 12 over the comparatively wide mesa 11d to mimic the surface topography of the blanket aperture fill layer 12 over the comparatively narrow mesas 11a, 11b and 11c. Such additional surface topography may be effected, for example and without limitation, while employing photolithographic and etch methods as are disclosed within Varian et al., in U.S. Pat. No. 5,880,007, as cited within the Description of the Related Art, the teachings of all of which related art are incorporated herein fully by reference. However, although not required within the present invention and the first preferred embodiment of the present invention, it may be preferred within the present invention and the first preferred embodiment of the present invention that the surface of the comparatively wide mesa 11d not be reached incident to forming within the blanket aperture fill layer 12 over the comparatively wide mesa lid such additional surface topography.

Referring now to FIG. 2, there is shown a schematic cross-sectional diagram illustrating the results of further processing of the microelectronic fabrication whose schematic cross-sectional diagram is illustrated in FIG. 1.

Shown in FIG. 2 is a schematic cross-sectional diagram of to a microelectronic fabrication otherwise equivalent to the microelectronic fabrication whose schematic cross-sectional diagram is illustrated in FIG. 1, but wherein the blanket aperture fill layer 12 has been planarized to form a blanket planarized aperture fill layer 12'.

Within the present invention and the first preferred embodiment of the present invention, the blanket aperture fill layer 12 is planarized to form the blanket planarized aperture fill layer 12' while employing a first chemical mechanical polish (CMP) planarizing method (which is typically and preferably a first global (i.e., unmasked) chemical mechanical polish (CMP) planarizing method) optimized to provide for enhanced planarity of the blanket planarized aperture fill layer 12' when forming the blanket planarized aperture fill layer 12' from the blanket aperture fill layer 12 while employing the first chemical mechanical polish (CMP) planarizing method. Such enhanced planarity may be effected when forming from the blanket aperture fill layer 12 the blanket planarized aperture fill layer 12' by appropriate selection of a chemical mechanical polish (CMP) slurry composition, or in the alternative appropriate control of operating parameters of a chemical mechanical polish (CMP) planarizing apparatus which employs the chemical mechanical polish (CMP) slurry composition. In particular with respect to appropriate control of operating parameters of the chemical mechanical polish (CMP) planarizing apparatus, it has been determined experimentally that by employing within a chemical mechanical polish (CMP) planarizing apparatus: (1) a comparatively low chemical mechanical polish (CMP) planarizing pressure (in a range of from about 0.5 to about 3.5 pounds per square inch (psi) in comparison with a conventional chemical mechanical polish (CMP) planarizing pressure of from about 3 to about 7 pounds per square inch (psi)) and a comparatively high chemical mechanical polish planarizing velocity (of from about 25 to about 120 revolutions per minute (rpm) for an eight inch diameter topographic substrate, in comparison with a conventional chemical mechanical polish (CMP) planarizing velocity of from about 25 to about 120 revolutions per minute (rpm)) there is obtained within the present invention and the preferred embodiment of the present invention the enhanced planarity desired when forming while employing the first chemical mechanical polish (CMP) planarizing method the blanket planarized aperture fill layer 12' from the blanket aperture fill layer 12.

Referring now to FIG. 3, there is shown a schematic cross-sectional diagram illustrating the results of further processing of the microelectronic fabrication whose schematic cross-sectional diagram is illustrated in FIG. 2.

Shown in FIG. 3 is a schematic cross-sectional diagram of a microelectronic fabrication otherwise equivalent to the microelectronic fabrication whose schematic cross-sectional diagram is illustrated in FIG. 2, but wherein the blanket planarized aperture fill layer 12' is further planarized to form a series of patterned planarized aperture fill layers 12a', 12b', 12c', 12d' and 12e', within a series of apertures including the pair of comparatively narrow apertures 13a and 13b and the comparatively wide aperture 13c.

Within the present invention and the first preferred embodiment of the present invention, to form from the blanket planarized aperture fill layer 12' the series of patterned planarized aperture fill layers 12a', 12b', 12c', 12d', there is employed a second planarizing method (which is similarly also typically and preferably a global (i.e., unmasked) planarizing method) which is optimized primarily to provide an enhanced selectivity for the material from which is formed the blanket planarized aperture fill layer 12' with respect to the material from which is formed at least the comparatively narrow mesas 11a, 11b and 11c and the comparatively wide mesa 11d within the topographic substrate 10.

Within the present invention and the first preferred embodiment of the present invention, the second planarizing method may be selected from the group including but not limited to isotropic wet chemical etch planarizing methods, isotropic or anisotropic reactive ion etch (RIE) plasma or non-reactive plasma etch planarizing methods and a second chemical mechanical polish (CMP) planarizing method. When employing as a second planarizing method a second chemical mechanical polish (CMP) planarizing method, the second chemical mechanical polish (CMP) planarizing method will typically and preferably employ at least one of: (1) a different chemical mechanical polish (CMP) slurry composition in comparison with the first chemical mechanical polish (CMP) planarizing method; and (2) a different set of chemical mechanical polish (CMP) planarizing apparatus operating parameters in comparison with the first chemical mechanical polish (CMP) planarizing method. Similarly, under circumstances where the second chemical mechanical polish (CMP) planarizing method employs only a different set of chemical mechanical polish (CMP) planarizing apparatus operating parameters in comparison with the first chemical mechanical polish (CMP) planarizing method, it is plausible and preferred within the present invention and the first preferred embodiment of the present invention that the first chemical mechanical polish (CMP) planarizing method and the second chemical mechanical polish (CMP) planarizing method may be undertaken sequentially in-situ.

Similarly with the first chemical mechanical polish (CMP) planarizing method, it has been determined experimentally for the second chemical mechanical polish (CMP) planarizing method that by employing the same comparatively low chemical mechanical polish (CMP) planarizing pressure as disclosed above, in conjunction with a comparatively low chemical mechanical polish (CMP) planarizing velocity (such as from about 25 to about 120 revolutions per minute (rpm) for an eight inch diameter topographic substrate, in comparison with a conventional velocity of from about 25 to about 120 revolutions per minute) there is effected within the second chemical mechanical polish (CMP) planarizing method the desired selectivity of the material from which is formed the blanket planarized aperture fill layer 12' with respect to the material from which is formed the topographic substrate 10.

Upon forming the microelectronic fabrication whose schematic cross-sectional diagram is illustrated in FIG. 3, there is formed a microelectronic fabrication having formed within a series of apertures within a topographic substrate a series of patterned planarized aperture fill layers formed employing a chemical mechanical polish (CMP) planarizing method, wherein the series of patterned planarized aperture fill layers is formed with enhanced planarity while attenuating erosion of the topographic substrate. The present invention realizes the foregoing object by employing as the chemical mechanical polish (CMP) planarizing method a two-step method which comprises: (1) a first chemical polish (CMP) planarizing method optimized primarily to provide enhanced planarity of a blanket planarized aperture fill layer formed from a blanket aperture fill layer in turn formed into the aperture within the topographic substrate; and (2) a second planarizing method optimized primarily to provide enhanced selectivity of the material from which is formed the blanket planarized aperture fill layer in comparison with the material from which is formed the topographic substrate.

Second Preferred Embodiment

Figure 4:
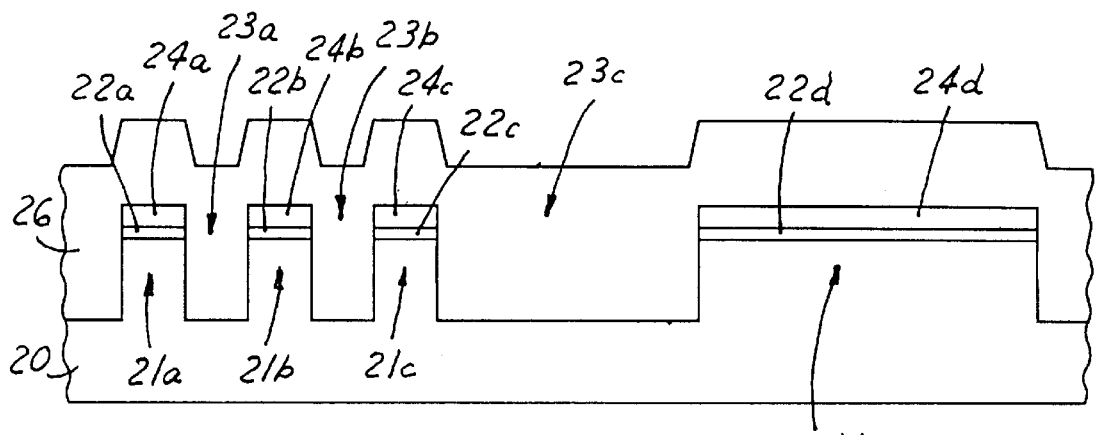
FIG. 4, FIG. 5 and FIG. 6 show a series of schematic cross-sectional diagrams illustrating the results of progressive stages in forming, in accord with a more specific embodiment of the present invention which comprises a second preferred embodiment of the present invention, a series of patterned planarized trench isolation regions within a series of isolation trenches within a topographic semiconductor substrate employed within a semiconductor integrated circuit microelectronic fabrication.
Figure 5:
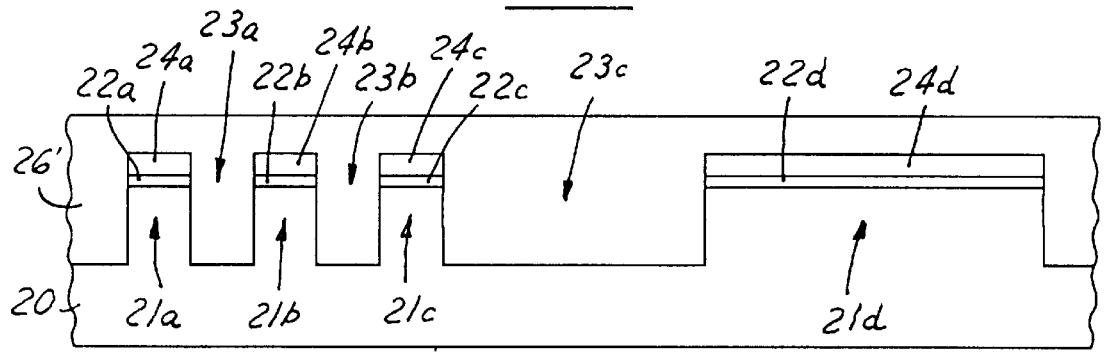
Figure 6:
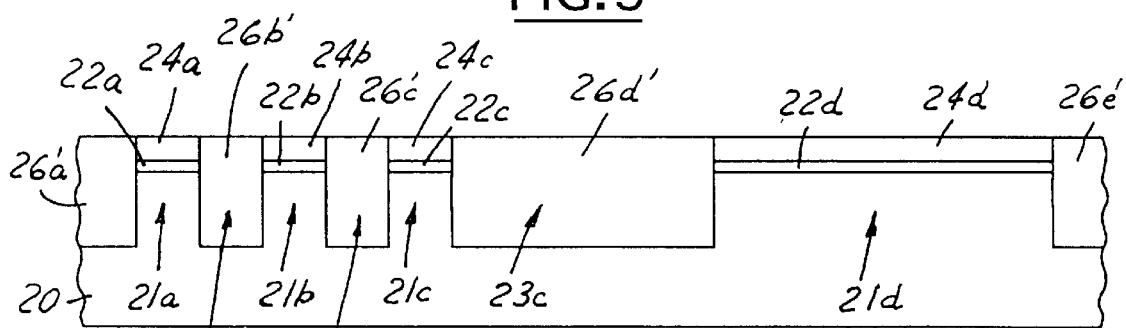

Referring now to FIG. 4 to FIG. 6, there is shown a series of schematic cross-sectional diagrams illustrating the results of progressive stages in forming, in accord with a more specific embodiment of the present invention which comprises a second preferred embodiment of the present invention, a series of patterned planarized trench isolation regions within a series of isolation trenches within a topographic semiconductor substrate employed within a semiconductor integrated circuit microelectronic fabrication. Shown in FIG. 4 is a schematic cross-sectional diagram of the semiconductor integrated circuit microelectronic fabrication at an early stage in its fabrication in accord with the second preferred embodiment of the present invention.

Shown in FIG. 4, in a first instance, is a topographic semiconductor substrate 20 characterized by a series of comparatively narrow mesas 21a, 21b and 21c which are separated by a pair of comparatively narrow isolation trenches 23a and 23b, where the series of comparatively narrow mesas 21a, 21b and 21c is in turn separated from a comparatively wide mesa 21d by a comparatively wide isolation trench 23c. Within the second preferred embodiment of the present invention, the series of comparatively narrow mesas 21a, 21b and 21c, the pair of comparatively narrow isolation trenches 23a and 23b, the comparatively wide mesa 21d and the comparatively wide isolation trench 23c are typically and preferably formed of dimensions analogous or equivalent to the dimensions employed for forming the series of comparatively narrow mesas 11a, 11b and 11c, the pair of comparatively narrow apertures 13a and 13b, the comparatively wide mesa 11d and the comparatively wide aperture 13c within the topographic substrate 10 within the microelectronic fabrication of the first preferred embodiment of the present invention as illustrated within the schematic cross-sectional diagram of FIG. 1. Otherwise, in general with respect to the topographic semiconductor substrate 20 as illustrated within the schematic cross-sectional diagram of FIG. 1, although it is known in the art of semiconductor integrated circuit microelectronic fabrication that semiconductor substrates are available with either dopant polarity, several dopant concentrations and various crystallographic orientations, for the second preferred embodiment of the present invention the topographic semiconductor substrate 20 is typically and preferably a (100) silicon semiconductor substrate having an N- or P- doping.

There is also shown within the schematic cross-sectional diagram of FIG. 4 formed upon each of the series of comparatively narrow mesas 21a, 21b and 21c and the comparatively wide mesa 21d a corresponding series of patterned pad oxide layers 22a, 22b, 22c and 22d having in turn formed and aligned thereupon a series of patterned silicon nitride layers 24a, 24b 24c and 24d. Within the second preferred embodiment of the present invention, the series of patterned pad oxide layers 22a, 22b, 22c and 22d is typically and preferably formed employing a thermal oxidation of a semiconductor substrate from which is formed the topographic semiconductor substrate 20, at a temperature of from about 1100 degrees centigrade to form the series of patterned pad oxide layers 22a, 22b, 22c and 22d each of thickness from about 90 to about 110 angstroms. Similarly, within the second preferred embodiment of the present invention with respect to the series of patterned silicon nitride layers 24a, 24b, 24c and 24d, each of the series of patterned silicon nitride layers 24a, 24b, 24c and 24d may be formed employing methods as are conventional in the art of semiconductor integrated circuit microelectronic fabrication, such methods including but not limited to chemical vapor deposition (CVD) methods and physical vapor deposition (PVD) methods, to form each of the patterned silicon nitride layers 24a, 24b, 24c and 24d to a thickness of from about 1000 to about 2000 angstroms.

Within the second preferred embodiment of the present invention with respect to the series of patterned pad oxide layers 22a, 22b, 22c and 22d, the series of patterned pad oxide layers 22a, 22b, 22c and 22d is typically and preferably employed as a series of stress reducing layers formed interposed between the series of comparatively narrow mesas 21a, 21b and 21c and the comparatively wide mesa 21d, and the series of patterned silicon nitride layers 24a, 24b, 24c and 24d. Similarly, within the second preferred embodiment of the present invention with respect to the series of patterned silicon nitride layers 24a, 24b, 24c and 24d, the series of patterned silicon nitride layers 24a, 24b, 24c and 24d is typically formed as a series of chemical mechanical polish (CMP) planarizing stop layers. However, since in accord with the first preferred embodiment of the present invention the present invention does not necessarily employ a chemical mechanical polish (CMP) planarizing when reaching the series of patterned silicon nitride layers 24a, 24b, 24c and 24d, both the series of patterned pad oxide layers 22a, 22b, 22c and 22d and the series of patterned silicon nitride layers 24a, 24b, 24c and 24d are optional within the second preferred embodiment of the present invention and may be replaced, if they are replaced at all, for example and without limitation, with a series of patterned polysilicon layers.

Finally, there is also shown within the schematic cross-sectional diagram of FIG. 4 a blanket isolation trench fill dielectric layer 26 formed into a series of trenches including the pair of comparatively narrow isolation trenches 23a and 23b and the comparatively wide isolation trench 23c.

Within the second preferred embodiment of the present invention with respect to the blanket isolation trench fill dielectric layer 26, the blanket isolation trench fill dielectric layer 26 is typically and preferably formed of an isolation trench fill dielectric material as is conventional in the art of semiconductor integrated circuit microelectronic fabrication, such as but not limited to a silicon oxide isolation trench fill dielectric material, a silicon nitride isolation trench fill dielectric material or a silicon oxynitride isolation trench fill dielectric material, and more typically and preferably a silicon oxide isolation trench fill dielectric material. Simialrly, and analogously with the blanket aperture fill layer 12 as employed within the first preferred embodiment of the present invention as illustrated within the schematic cross-sectional diagram of FIG. 1, the blanket isolation trench fill dielectric layer 26, although illustrated as being formed with a profile consistent with a high density plasma chemical vapor deposition (HDP-CVD) method, may also be formed employing other deposition methods, including but not limited to thermal chemical vapor deposition (CVD) methods (such as but not limited to low pressure thermal chemical vapor deposition (LPCVD) methods, subatmospheric pressure thermal chemical vapor deposition (SACVD) methods and atmospheric pressure thermal chemical vapor deposition (APCVD) methods), other plasma enhanced chemical vapor deposition (PECVD) methods and physical vapor deposition (PVD) methods (such as but not limited to sputtering methods).

When formed of a silicon oxide isolation trench fill dielectric material formed employing a high density plasma chemical vapor deposition (HDP-CVD) method upon an eight inch diameter topographic semiconductor substrate 20, the high density plasma chemical vapor deposition (HDP-CVD) methods also employs: (1) a reactor chamber pressure of from about 3 to about 12 mtorr; (2) a top source radio frequency power of from about 1000 to about 1500 watts at a source radio frequency of side source radio frequency of 2 MHZ and a bias power of from about 2500 to about 3500 watts; (3) a topographic semiconductor substrate 20 temperature of from about 600 to about 700 degrees centigrade; (4) a silane silicon source material flow rate of from about 50 to about 150 standard cubic centimeters per minute (sccm); (5) an $O_2$ oxidant source material flow rate of from about 100 to about 300 standard cubic centimeters per minute (sccm); and (6) an argon sputtering gas flow rate of from about 0 to about 150 standard cubic centimeters per minute (sccm).

Referring now to FIG. 5, there is shown a schematic cross-sectional diagram illustrating the results of further processing of the semiconductor integrated circuit microelectronic fabrication whose schematic cross-sectional diagram is illustrated in FIG. 4.

Shown in FIG. 5 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 4, but wherein the blanket isolation trench fill dielectric layer 26 has been planarized to form a blanket planarized isolation trench fill dielectric layer 26'. Within the second preferred embodiment of the present invention, the blanket isolation trench fill dielectric layer 26 is planarized to form the blanket planarized isolation trench fill dielectric layer 26' while employing a first chemical mechanical polish (CMP) planarizing method analogous with the first chemical mechanical polish (CMP) planarizing method employed within the first preferred embodiment of the present invention for forming from the blanket aperture fill layer 12 as illustrated within the schematic cross-sectional diagram of FIG. 1 the blanket planarized aperture fill layer 12' as illustrated within the schematic cross-sectional diagram of FIG. 2. In particular, the first chemical mechanical polish (CMP) planarizing method is optimized to provide an enhanced planarity of the blanket planarized isolation trench fill dielectric layer 26' when chemical mechanical polish (CMP) planarized from the blanket isolation trench fill dielectric layer 26 while employing the first chemical mechanical polish (CMP) planarizing method.

Similarly in accord with the first preferred embodiment of the present invention, in order to achieve the foregoing result, it has been found experimentally that it is desirable to employ a comparatively low chemical mechanical polish (CMP) planarizing pressure and a comparatively high chemical mechanical polish (CMP) planarizing velocity when chemical mechanical polish (CMP) planarizing the blanket isolation trench fill dielectric layer 26 when forming the blanket planarized isolation trench fill dielectric layer 26' while employing the first chemical mechanical polish (CMP) planarizing method. Similarly also in accord with the first preferred embodiment of the present invention, a choice of specific chemical mechanical polish (CMP) planarizing slurry composition may also effect enhanced planarization within the first chemical mechanical polish (CMP) planarizing method.

Thus, within the context of the second preferred embodiment of the present invention, it has been determined experimentally that there may be employed when chemical mechanical polish (CMP) planarizing the blanket isolation trench fill dielectric layer 26 when forming the blanket planarized isolation trench fill dielectric layer 26' a commercially available chemical mechanical polish (CMP) slurry composition (such as but not limited to Cabot Chemical Company product number SS25, Hitachi Chemical Company product number 8005 or Showa Denko Chemical Company product number GPL-C S2115) employed at the comparatively low chemical mechanical polish (CMP) planarizing pressure of from about 2.5 to about 4.5 pounds per square inch (psi) and the comparatively high chemical mechanical polish (CMP) planarizing velocity of from about 60 to about 120 revolutions per minute (rpm). Thus, the first chemical mechanical polish (CMP) planarizing method also employs when chemical mechanical polish (CMP) planarizing the blanket isolation trench fill dielectric layer 26 formed upon an eight inch diameter topographic semiconductor substrate 20: (1) a platen pressure of from about 2.5 to about 4.5 psi; (2) a head rotation speed of from about 60 to about 120 revolutions per minute (rpm); (3) a platen counter rotation speed of from about 60 to about 120 revolutions per minute (rpm); (4) a topographic semiconductor substrate 20 temperature of from about 600 to about 700 degrees centigrade; (5) an aqueous silica slurry composition of from about 1 to about 20 weight percent silica; and (6) a slurry feed rate of from about 150 to about 250 cubic centimeters per minute (ccm).

Referring now to FIG. 6, there is shown a schematic cross-sectional diagram illustrating the results of further processing of the semiconductor integrated circuit microelectronic fabrication whose schematic cross-sectional diagram is illustrated in FIG. 5.

Shown in FIG. 6 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 5, but wherein the blanket planarized isolation trench fill dielectric layer 26' has been planarized to form a series of patterned planarized trench isolation regions 26a', 26b', 26c', 26d' and 26e'.

Analogously within the first preferred embodiment of the present invention, the blanket planarized isolation trench fill dielectric layer 26' as illustrated within the schematic cross-sectional diagram of FIG. 5 is planarized to form the series of patterned planarized trench isolation regions 26a', 26b', 26c', 26d', and 26e' as illustrated within the schematic cross-sectional diagram of FIG. 6 while employing a second planarizing method which has an optimized selectivity of the material from which is formed the blanket planarized isolation trench fill dielectric layer 26' with respect to the material from which is formed the patterned silicon nitride layers 24a, 24b, 24c and 24d, or the material from which is formed a series of layers which substitutes for the series of patterned silicon nitride layers 24a, 24b, 24c and 24d.

Also analogously with the first preferred embodiment of the present invention, the second planarizing method may be selected from the group of planarizing methods including but not limited to isotropic wet chemical etch planarizing method (such as but not limited to dilute hydrofluoric acid isotropic wet chemical etch planarizing methods and buffered oxide etchant isotropic wet chemical etch planarizing methods), reactive ion etch (RIE) dry plasma planarizing methods (such as but not limited to active fluorine containing plasma reactive ion etch (RIE) dry plasma planarizing methods), non-reactive dry plasma planarizing methods (such as sputtering methods) and a second chemical mechanical polish (CMP) planarizing method.

When employing as a planarizing method a second chemical mechanical polish (CMP) planarizing method, it has been determined experimentally, in accord with the first preferred embodiment of the present invention, that such a second chemical mechanical polish (CMP) planarizing method may employ the same chemical mechanical polish (CMP) slurry composition as employed within the first chemical mechanical polish (CMP) planarizing method, but employed at a comparatively low chemical mechanical polish (CMP) planarizing pressure of from about 2.5 to about 4.5 pounds per square inch (psi) and a comparatively low chemical mechanical polish (CMP) planarizing velocity of from about 60 to about 120 revolutions per minute (rpm). Such a second chemical mechanical polish (CMP) planarizing method also employs: (1) a platen pressure of from about 2.5 to about 4.5 pounds per square inch (psi); (2) a head rotation speed of from about 60 to about 120 revolutions per minute (rpm); (3) a platen counter rotation speed of from about 60 to about 120 revolutions per minute (rpm); (4) an aqueous silica slurry of silica concentration from about 1 to about 20 weight percent; and (5) a slurry feed rate of from about 150 to about 250 cubic centimeters per minute (ccm).

Upon forming the semiconductor integrated circuit microelectronic fabrication whose schematic cross-sectional diagram is illustrated in FIG. 6, there is formed a semiconductor integrated circuit microelectronic fabrication having formed therein a series of patterned planarized trench isolation regions formed within a series of isolation trenches within a topographic semiconductor substrate with enhanced planarity of the series of patterned planarized trench isolation regions and attenuated erosion of the topographic semiconductor substrate. The present invention realizes the foregoing objects by employing when forming the series of patterned planarized trench isolation regions: (1) a first chemical mechanical polish (CMP) planarizing method optimized to provide an enhanced planarity of a blanket planarized isolation trench fill dielectric layer formed from a blanket isolation trench fill dielectric layer; and (2) a second planarizing method optimized to provide enhanced selectivity of the material from which is formed the blanket planarized isolation trench fill dielectric layer with respect to the topographic semiconductor substrate.

EXAMPLES

There was obtained a series of topographic semiconductor substrates which were fabricated generally in accord with the semiconductor integrated circuit microelectronic fabrication whose schematic cross-sectional diagram is illustrated in FIG. 4. The series of topographic semiconductor substrates had formed therein three separate mesa regions of linewidth dimensions either: (1) 40 microns by 40 microns; (2) 80 microns by 110 microns; or (3) 400 microns by 800 microns. Each of the mesa regions had formed thereupon a corresponding series of co-extensive series of pad oxide layers of thickness about 110 angstroms, in turn having formed thereupon a series of co-extensive silicon nitride layers of thickness about 1700 angstroms each. Similarly, the topographic semiconductor substrates also had formed therein isolation trench regions of isolation trench width dimensions either: (1) 40 microns by 80 microns; (2) 80 microns by 130 microns; or (3) 400 microns by 450 microns. There was then formed covering each topographic semiconductor substrate within the series of topographic semiconductor substrates a blanket silicon oxide isolation trench fill dielectric layer formed employing a high density plasma chemical vapor deposition (HDPCVD) method formed to a thickness of about 6000 angstroms.

The high density plasma chemical vapor deposition (HDP-CVD) method also employed: (1) a reactor chamber pressure of about 7.5 mtorr; (2) a top source radio frequency power of 1200 watts at a source radio frequency of 2 MHZ, and a side bias power of about 3000 watts; (3) a topographic semiconductor substrate temperature of about 600 degrees centigrade; (4) a silane silicon source material flow rate of about 130 standard cubic centimeters per minute (sccm); (5) a $O_2$ oxidant source material flow rate of about 250 standard cubic centimeters per minute (sccm).

The series of topographic semiconductor substrates was then divided into three groups of topographic semiconductor substrates and samples from each of the three groups of topographic semiconductor substrates were then chemical mechanical polish (CMP) planarized while employing one of the following three chemical mechanical polish (CMP) planarizing slurry compositions: (1) Cabot Chemical Company product number SS25; (2) Hitachi Chemical Company product number HS-8005; and (3) Showa Denko Chemical Company product number GPL-C S2115. For each of the foregoing chemical mechanical polish (CMP) slurry compositions, there was employed: (1) a chemical mechanical polish (CMP) planarizing pressure of about 4 pounds per square inch (psi); (2) a head rotation speed of about 104 revolutions per minute (rpm); (3) a platen counter rotation speed of about 118 revolutions per minute (rpm); (4) an aqueous chemical mechanical polish (CMP) slurry composition of about 1 to about 8 weight percent silica; and (5) a slurry feed rate of about 200 cubic centimeters per minute (ccm).

Figure 7A:
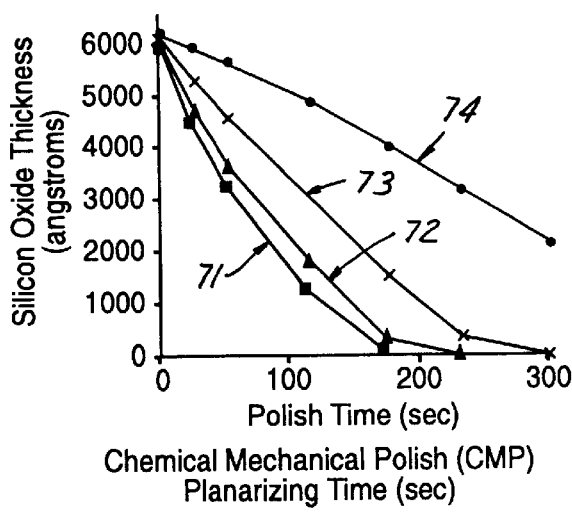
FIG. 7a, FIG. 7b, FIG. 8a, FIG. 8b, FIG. 9a, FIG. 9b, FIG. 10 and FIG. 11 show a series of graphs of Silicon Oxide or Silicon Nitride Thickness versus Chemical Mechanical Polish (CMP) Planarizing Time for forming a series of patterned planarized trench isolation regions within a series of isolation trenches within a series of topographic semiconductor substrates in accord with the examples of the present invention.
Figure 7B:
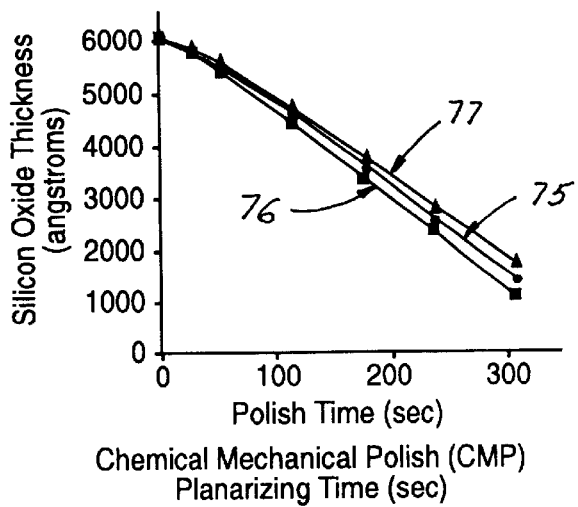
Figure 8A:
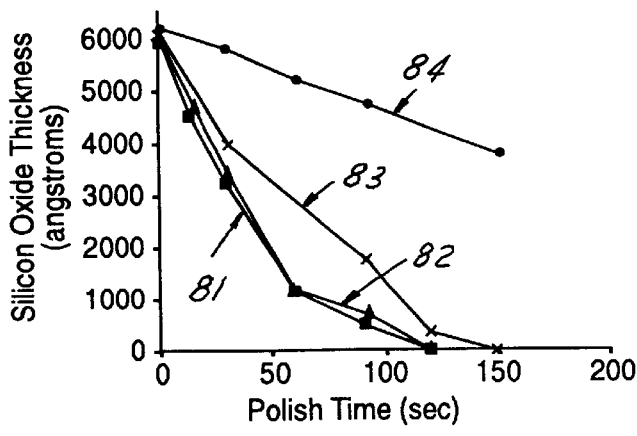
Figure 8B:
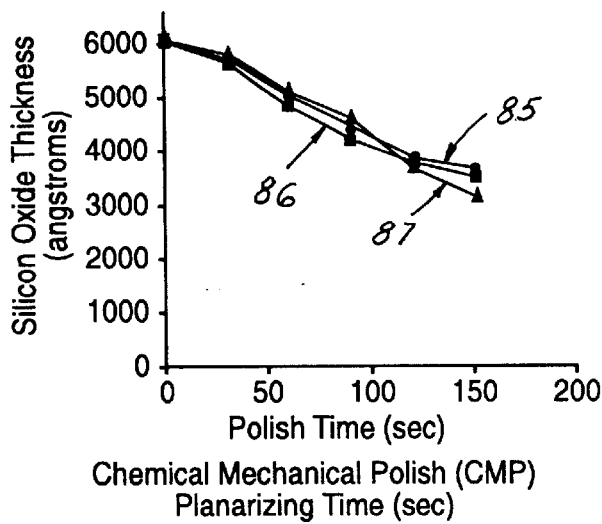
Figure 9A:
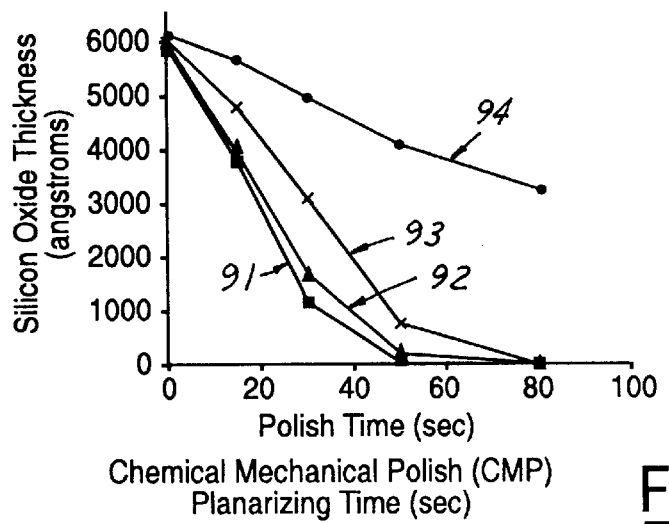
Figure 9B:
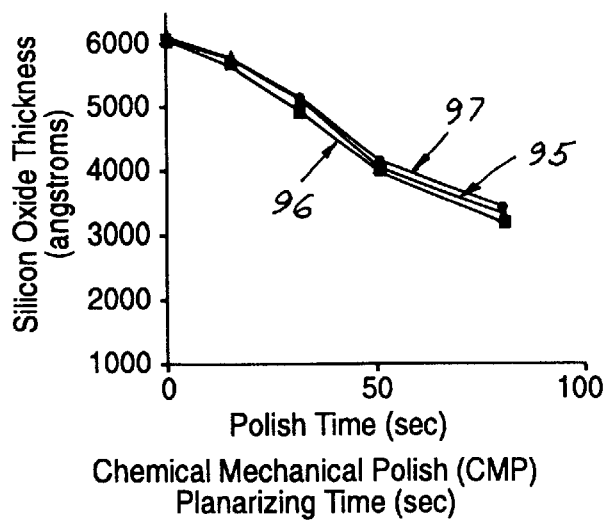

At various chemical mechanical polish (CMP) planarizing time intervals for each of the chemical mechanical polish (CMP) slurry compositions samples of the topographic semiconductor substrates were obtained and thicknesses of the chemical mechanical polish (CMP) planarized isolation trench fill dielectric layers were measured. The results of the measurements are shown within the graphs of FIG. 7a, FIG. 7b, FIG. 8a, FIG. 8b, FIG. 9a and FIG. 9b, where the results as plotted in FIG. 7a and FIG. 7b were obtained employing the chemical mechanical polish (CMP) slurry composition obtained from Cabot Chemical Company, the results as plotted in FIG. 8a and FIG. 8b were obtained employing the chemical mechanical polish (CMP) slurry composition obtained from Hitachi Chemical Company and the results as plotted in FIG. 9a and 9b were obtained employing the chemical mechanical polish slurry composition obtained from Showa Denko Chemical Company.

Within the respective graphs, curves corresponding with reference numerals 71, 81 and 91 correspond with silicon oxide thickness over the mesas of linewidth 40 microns by 40 microns. Similarly, curves corresponding with reference numerals 72, 82 and 92 correspond with silicon oxide thickness over the mesas of linewidth 80 microns by 110 microns. Yet similarly, curves corresponding with reference numerals 73, 83 and 93 correspond silicon oxide thicknesses over the mesas of linewidth 400 microns by 800 microns. Still yet similarly, curves corresponding with reference numerals 74, 84 and 94 correspond with the average silicon oxide thicknesses over all of the trenches. In addition, curves corresponding with reference numerals 75, 85 and 95 correspond with silicon oxide thicknesses over the trenches of aperture width 40 microns by 80 microns. Further, curves corresponding with reference numerals 76, 86 and 96 correspond with silicon oxide thicknesses over the isolation trenches of aperture width 80 microns by 130 microns. Finally, curves corresponding with reference numerals 77, 87 and 97 correspond with silicon oxide thicknesses over the isolation trenches of aperture width 400 microns by 450 microns.

As is seen from review of the data within FIG. 7a, FIG. 7b, FIG. 8a, FIG. 8b, FIG. 9a and FIG. 9b, there is observed in general a substantial independence of silicon oxide polishing rate for any of the chemical mechanical polish (CMP) slurry compositions for the silicon oxide layers when formed over the isolation trenches of any of the aperture widths. However, there is also observed for any of the chemical mechanical polish slurry compositions a generally more rapid, but not extensive, planarization of the silicon oxide isolation trench fill dielectric layers formed over mesas of narrower linewidth than over mesas of wider linewidth, further in turn in comparison with the planarization rates of the silicon oxide isolation trench fill dielectric layers over the isolation trenches of any aperture width. Thus, since the blanket isolation trench fill dielectric layers are formed to a higher level over mesas within the topographic semiconductor substrate than over isolation trenches within the semiconductor substrate, the data as plotted within FIG. 7a, FIG. 7b, FIG. 8a, FIG. 8b, FIG. 9a and FIG. 9b indicate good planarity when forming from the blanket isolation trench fill dielectric layers the blanket planarized isolation trench fill dielectric layers.

Figure 10:
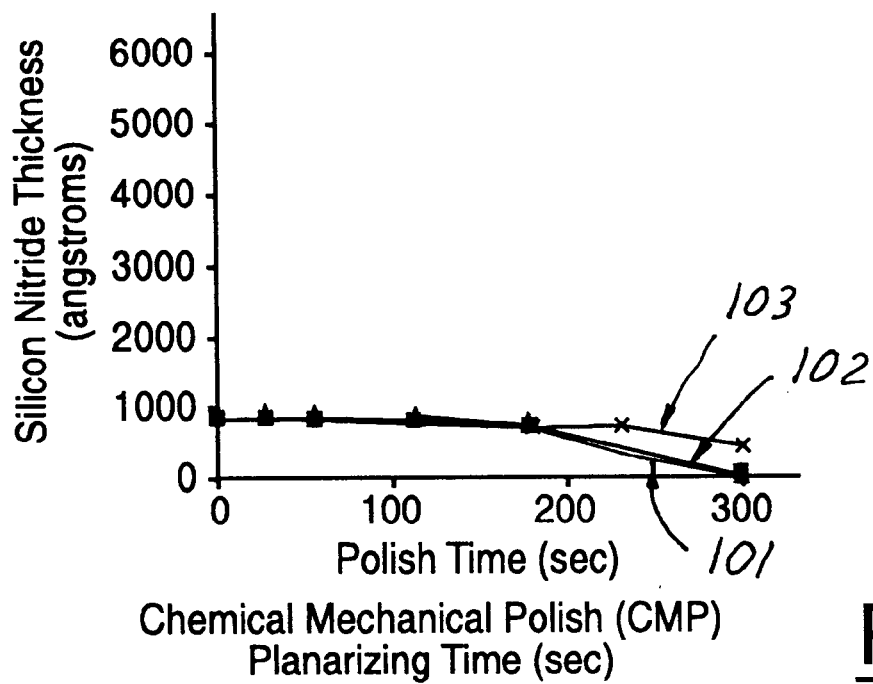
Figure 11:
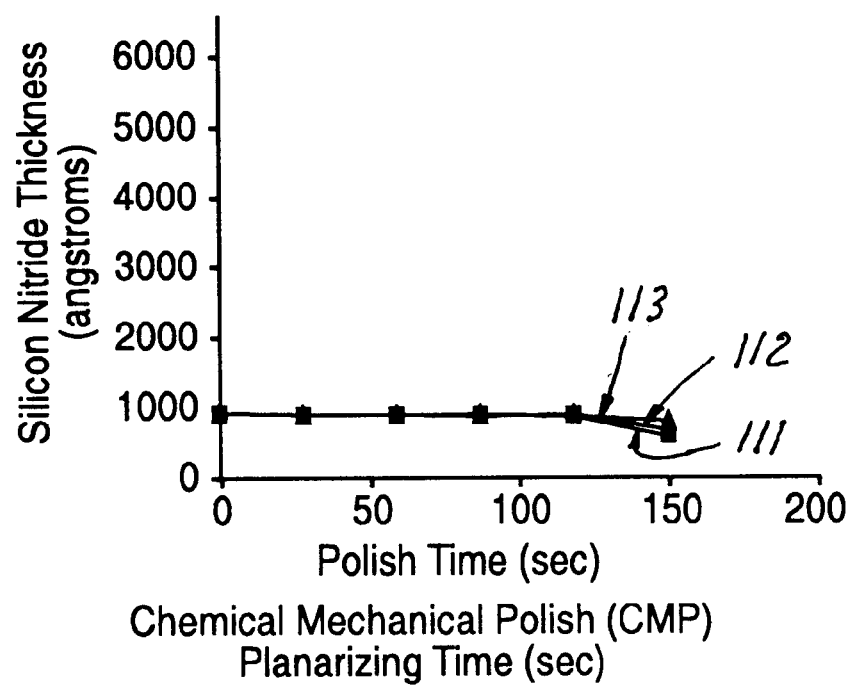

Finally, there is shown in FIG. 10 and FIG. 11 a pair of graphs of Silicon Nitride Layer Thickness versus Chemical Mechanical Polish (CMP) Planarizing Time for either the chemical mechanical polish (CMP) planarizing composition obtained from Cabot Chemical Company (FIG. 10) or the chemical mechanical polish (CMP) planarizing composition obtained from Hitachi Chemical Company (FIG. 11). The data obtained within the graphs of FIG. 10 and FIG. 11 was obtained employing chemical mechanical polish (CMP) planarizing conditions otherwise analogous to the chemical mechanical polish (CMP) planarizing conditions employed for obtaining the data within all of the foregoing graphs, but with the exception that there was employed with the comparatively low chemical mechanical polish (CMP) planarizing pressure of about 4 pounds per square inch (psi) a comparatively low chemical mechanical polish (CMP) planarizing velocity of about 118 revolutions per minute (rpm), after having chemical mechanical polish (CMP) planarized the blanket planarized isolation trench fill dielectric layers to form a series of patterned planarized trench isolation regions with various of the topographic semiconductor substrates.

Within the corresponding FIG. 10 or FIG. 11, reference numerals 101 and 111 correspond with silicon nitride layer thicknesses which comprise the mesas of linewidth 40 microns by 40 microns. Similarly, reference numerals 102 and 112 correspond with silicon nitride layer thickness which comprise the mesas of linewidth 80 microns by 110 microns. Finally, reference numerals 103 and 113 correspond with the silicon nitride layer thicknesses which comprise the mesas of linewidth 400 microns by 800 microns.

As is seen from review of the data within FIG. 10 and FIG. 11, either of the chemical mechanical polish (CMP) slurry compositions provides limited silicon nitride layer erosion, at least up to about 150 seconds chemical mechanical polish (CMP) planarization time. Thus there is illustrated within the context of the present invention that there may be employed a single chemical mechanical polish (CMP) slurry composition in-situ within a sequential pair of chemical mechanical polish (CMP) planarizing methods to provide enhanced planarity of a patterned planarized aperture fill layer and attenuated topographic substrate erosion when forming the patterned planarized aperture fill layer within an aperture within the topographic substrate.

As is understood by a person skilled in the art, the preferred embodiments and examples of the present invention are illustrative of the present invention rather than limiting of the present invention. Revisions and modifications may be made to methods, materials, structures and dimensions through which is provided a patterned planarized aperture fill layer or a patterned planarized trench isolation region, in accord with the preferred embodiments and examples of the present invention while still providing a patterned planarized aperture fill layer or a patterned planarized trench isolation region in accord within the present invention, as defined by the appended claims.

What is claimed is:

1. A method for forming an aperture fill layer within a aperture comprising:

providing a topographic substrate having an aperture formed therein;

forming over the topographic substrate and filling the aperture a blanket aperture fill layer;

planarizing, while employing a first chemical mechanical polish (CMP) planarizing method, the blanket aperture fill layer to form a blanket planarized aperture fill layer while not reaching the topographic substrate, the first chemical mechanical polish CMP) planarizing method being optimized to provide an enhanced planarity of the blanket planarized aperture fill layer formed from the blanket aperture fill layer; and planarizing, while employing a second planarizing method selected from the group consisting of wet chemical etch back planarizing methods and plasma etch back planarizing methods, the blanket planarized aperture fill layer to form within the aperture a patterned planarized aperture fill layer.

2. The method of claim 1 wherein the substrate is employed within a microelectronic fabrication selected from the group consisting of integrated circuit microelectronic fabrications, ceramic substrate microelectronic fabrications, solar cell optoelectronic fabrications, sensor image array optoelectronic microelectronic fabrications and display image array optoelectronic microelectronic fabrications.

3. The method of claim 1 wherein the substrate is formed from a material selected from the group consisting of conductor materials, semiconductor materials, dielectric materials, laminates thereof, aggregates thereof and composites thereof.

4. The method of claim 1 wherein the blanket aperture fill layer is formed from a material selected from the group consisting of conductor materials, semiconductor materials and dielectric materials.

5. The method of claim 1 wherein the first chemical mechanical polish (CMP) planarizing method is an unmasked chemical mechanical polish (CMP) planarizing method.

6. The method of claim 1 wherein:

the second planarizing method is a second chemical mechanical polish (CMP) planarizing method; and the second chemical mechanical polish (CMP) planarizing method is optimized to provide an enhanced selectivity of the material from which is formed the blanket planarized aperture fill layer with respect to the material from which is formed the topographic substrate when forming the patterned planarized aperture fill layer from the blanket planarized aperture fill layer.

7. The method of claim 6 wherein:

the first chemical mechanical polish (CMP) planarizing method and the second chemical mechanical polish (CMP) planarizing method employ a single chemical mechanical polish (CMP) slurry composition;

the first chemical mechanical polish (CMP) planarizing method employs a higher chemical mechanical polish (CMP) planarizing velocity in comparison with the second chemical mechanical polish (CMP) planarizing method; and the first chemical mechanical polish (CMP) planarizing method and the second chemical mechanical polish (CMP) planarizing method are undertaken sequentially in-situ.

8. The method of claim 1 wherein:

the topographic substrate comprises at least one comparatively narrow mesa and at least one comparatively wide mesa; and at least a portion of the blanket aperture fill layer formed over the comparatively wide mesa is removed prior to planarizing the blanket aperture fill layer to form the blanket planarized aperture fill layer.

9. The method of claim 8 wherein the comparatively wide mesa is not reached when the portion of the blanket aperture fill layer formed over the comparatively wide mesa is removed.

10. The method of claim 6 wherein the second chemical mechanical polish (CMP) planarizing method is an unmasked chemical mechanical polish (CMP) planarizing method.

11. A method for forming a trench isolation region within an isolation trench comprising:

providing a topographic semiconductor substrate having an isolation trench formed therein;

forming over the topographic semiconductor substrate and filling the isolation trench a blanket isolation trench fill dielectric layer;

planarizing, while employing a first chemical mechanical polish (CMP) planarizing method, the blanket isolation trench fill dielectric layer to form a blanket planarized isolation trench fill dielectric layer while not reaching the topographic semiconductor substrate, the first chemical mechanical polish (CMP) planarizing method being optimized to provide an enhanced planarity of the blanket planarized isolation trench fill dielectric layer formed from the blanket isolation trench fill dielectric layer; and planarizing, while employing a second planarizing method, the blanket planarized isolation trench fill dielectric layer to form within the isolation trench a patterned planarized trench isolation region.

12. The method of claim 11 wherein the first chemical mechanical polish (CMP) planarizing method is an unmasked chemical mechanical polish (CMP) planarizing method.

13. The method of claim 11 wherein the second planarizing method is selected from the group consisting of wet chemical etchback planarizing methods and plasma etchback planarizing methods.

14. The method of claim 11 wherein:

the second planarizing method is a second chemical mechanical polish (CMP) planarizing method; and the second chemical mechanical polish (CMP) planarizing method is optimized to provide an enhanced selectivity of the material from which is formed the blanket planarized isolation trench fill dielectric layer with respect to the material from which is formed the topographic semiconductor substrate when forming the patterned planarized trench isolation region from the blanket planarized isolation trench fill dielectric layer.

15. The method of claim 14 wherein:

the first chemical mechanical polish (CMP) planarizing method and the second chemical mechanical polish (CMP) planarizing method employ a single chemical mechanical polish (CMP) slurry composition;

the first chemical mechanical polish (CMP) planarizing method employs a higher chemical mechanical polish (CMP) planarizing velocity in comparison with the second chemical mechanical polish (CMP) planarizing method; and the first chemical mechanical polish (CMP) planarizing method and the second chemical mechanical polish (CMP) planarizing method are undertaken sequentially in-situ.

16. The method of claim 11 wherein:

the topographic semiconductor substrate comprises at least one comparatively narrow mesa and at least one comparatively wide mesa; and at least a portion of the blanket isolation trench fill dielectric layer formed over the comparatively wide mesa is removed prior to planarizing the blanket isolation trench fill dielectric layer to form the blanket planarized isolation trench fill dielectric layer.

17. The method of claim 16 wherein the comparatively wide mesa is not reached when the portion of the blanket isolation trench fill dielectric layer formed over the comparatively wide mesa is removed.

18. The method of claim 14 wherein the second chemical mechanical polish (CMP) planarizing method is an unmasked chemical mechanical polish (CMP) planarizing method.

* * * * *